(12) United States Patent
Kim

(10) Patent No.: US 7,585,696 B2
(45) Date of Patent: Sep. 8, 2009

(54) IMAGE SENSOR AND METHOD FOR MANUFACTURING THE SAME

(75) Inventor: Seoung Hyun Kim, Pocheon-goon (KR)

(73) Assignee: Dongbu Hitek Co., Ltd., Seoul (KR)

( * ) Notice: Subject to any disclaimer, the term of this patent is extended or adjusted under 35 U.S.C. 154(b) by 112 days.

(21) Appl. No.: 11/842,840

(22) Filed: Aug. 21, 2007

(65) Prior Publication Data

US 2008/0217722 A1    Sep. 11, 2008

(30) Foreign Application Priority Data

Mar. 9, 2007    (KR) ...................... 10-2007-0023307

(51) Int. Cl.
*H01L 21/00* (2006.01)
(52) U.S. Cl. .............................. 438/80; 438/63; 438/81; 438/83; 438/98; 257/458; 257/292; 257/444; 257/448; 257/459; 257/594; 257/E21.361; 257/E27.133

(58) Field of Classification Search ................... 438/80, 438/63, 81, 83, 98; 257/458, 292, 444, 448, 257/459, 594, E21.361, E27.133
See application file for complete search history.

(56) References Cited

U.S. PATENT DOCUMENTS 7,514,762 B2 *    4/2009    Deane ........................ 257/538

* cited by examiner

*Primary Examiner*—Tu-Tu V Ho
(74) *Attorney, Agent, or Firm*—Saliwanchik, Lloyd & Saliwanchik

(57) ABSTRACT

Disclosed are an image sensor and a method for manufacturing the same. The image sensor includes a substrate provided with a transistor circuit, first and second interconnections separated from each other on the substrate, a first conductive-type conductive layer formed at side surfaces of the first interconnection, a second conductive-type conductive layer formed at side surfaces of the second interconnection, and an intrinsic layer formed between the first and second conductive-type conductive layers thereby forming a P-I-N structure.

10 Claims, 6 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0023307, filed Mar. 9, 2007, which is hereby incorporated by reference in its entirety.

BACKGROUND

An image sensor is a semiconductor device for converting optical images into electric signals, and is mainly classified as a charge coupled device (CCD) image sensor or a complementary metal-oxide semiconductor (CMOS) image sensor.

The CMOS image sensor includes a photodiode and a MOS transistor in each unit pixel, and sequentially detects the electric signals of each unit pixel in a switching mode to realize images.

A CMOS image sensor according to the related art includes a photodiode area for receiving an optical signal and converting the optical signal into an electrical signal, and a transistor area for processing the electrical signal.

However, in the CMOS image sensor according to the related art, photodiodes and transistors are horizontally disposed, and the photodiodes are positioned on the same plane as that of a transistor circuitry.

Although the CMOS image sensor according to the related art overcomes the disadvantages of the CCD image sensor, problems still remain in the CMOS image sensor.

In other words, in the CMOS image sensor according to the related art, the photodiodes and the transistors are positioned on a substrate such that they are horizontally adjacent to each other. Accordingly, additional areas are required for the photodiodes. For this reason, a fill factor area may be reduced, and resolution may be restricted.

Further, the CMOS image sensor according to the related art has difficulties in optimizing the manufacturing process when the photodiodes and the transistors are simultaneously manufactured. In other words, although a rapid transistor manufacturing process requires a shallow junction in order to achieve low sheet resistance, the shallow junction is unstable for the photodiode manufacturing process.

In addition, in the CMOS image sensor according to the related art, since additional on-chip functions are provided in the CMOS image sensor, the size of a unit pixel must increase in order to maintain the sensitivity of the image sensor, or the area for the photodiode must decrease in order to maintain the size of a pixel. However, if the size of a pixel increases, the resolution of the CMOS image sensor may decrease, and if the area for the photodiode decreases, the sensitivity of the image sensor may decrease.

BRIEF SUMMARY

Accordingly, embodiments of the present invention provide an image sensor and a method of manufacturing the same, capable of providing a new scheme of integrating a transistor circuitry and a photodiode.

An image sensor and a method of manufacturing the same, capable of improving resolution and sensitivity, can be provided.

In addition, according to embodiments, an image sensor and a method of manufacturing the same, in which a photodiode is formed at the upper portion of a transistor circuitry, thereby ensuring an insulating property between unit pixels of photodiodes, can be provided.

According to one embodiment, there is provided an image sensor including a substrate provided with a transistor circuit and at least two lower interconnections, a first upper interconnection electrically connected to a first lower interconnection of the at least two lower interconnections, a second upper interconnection electrically connected to a second lower interconnection of the at least two lower interconnections, a first conductive-type conductive layer formed on at least one sidewall surface of the first upper interconnection, a second conductive-type conductive layer formed on at least one sidewall surface of the second interconnection, and an intrinsic layer formed between the first and second conductive-type conductive layers. The first conductive-type conductive layer, the intrinsic layer, and the second conductive-type conductive layer provide a diode structure that is horizontally arranged.

According to an embodiment, a method of manufacturing an image sensor includes forming a transistor circuit and at least two lower interconnections on a substrate, forming a first upper interconnection on a first lower interconnection of the at least two lower interconnections, forming a first conductive-type conductive layer on at least one sidewall surface of the first upper interconnection, forming an intrinsic layer on the substrate including the first conductive-type conductive layer and the first upper interconnection, forming a trench in the intrinsic layer corresponding to a second lower interconnection of the at least two lower interconnections, forming a second conductive-type conductive layer on at least one sidewall surface of the trench, and forming a second upper interconnection in the trench having the second conductive-type conductive layer.

According to another embodiment, a method of manufacturing an image sensor includes forming a transistor circuit including lower interconnections on a substrate, forming first and second interconnections corresponding to the lower interconnections on the substrate, forming a first conductive-type conductive layer at side surfaces of the first interconnection, forming a second conductive-type conductive layer at side surfaces of the second interconnection, and forming an intrinsic layer on the substrate including the first and second conductive-type conductive layers.

DETAILED DESCRIPTION

Hereinafter, an image sensor and a method of manufacturing the same according to embodiments of the present invention will be described with reference to the accompanying drawings.

In the following description, the expression "formed on/under each layer" may include the meaning of both "formed directly on/under each layer" and "formed indirectly on/under each layer."

Figure 1:
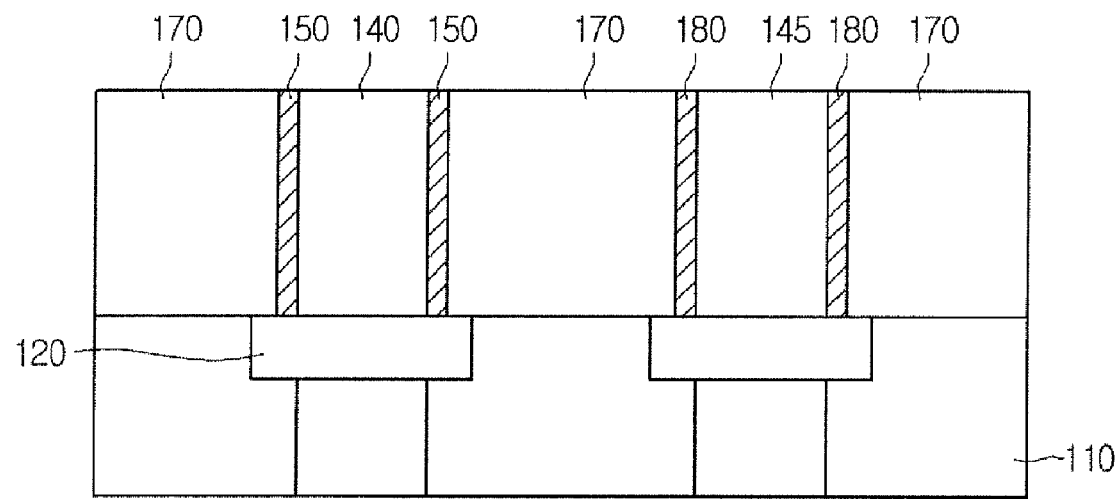
FIG. 1 shows a cross-sectional view of an image sensor according to an embodiment of the present invention.

FIG. 1 is a cross-sectional view showing an image sensor according to an embodiment.

Referring to FIG. 1, an image sensor, according to an embodiment, includes first and second interconnections 140 and 145, which are separated from each other on a substrate, a first conductive-type conductive layer 150 formed at side surfaces of the first interconnection 140, a second conductive-type conductive layer 180 formed at side surfaces of the second interconnection 145, and an intrinsic layer 170 formed between the first and second conductive-type conductive layers 150 and 180.

The first and second interconnections 140 and 145 can be formed corresponding to lower interconnections 120 formed in an interlayer dielectric layer (ILD) 110.

The first conductive-type conductive layer 150 can be formed at one side surface or two or more side surfaces of the first interconnection 140. When the first conductive-type conductive layer 150 is formed at two or more sides of the first interconnection 140, the first interconnection 140 can serve as a common interconnection or node.

The second conductive-type conductive layer 180 can be formed at one side surface or two or more side surfaces of the second interconnection 145. When the second conductive-type conductive layer 180 is formed at two or more side surfaces of the second interconnection 145, the second interconnection 145 can serve as a common interconnection or node.

In the image sensor according to these embodiments, the photodiode is positioned above transistor circuitry, so that a fill factor can approach 100%, and a higher sensitivity can be achieved relative to the same pixel size as compared with the related art.

Further, according to an embodiment, manufacturing costs can be reduced in order to achieve the same resolution as that of the related art, and each unit pixel can be realized utilizing more complicated circuitry without the decrease of sensitivity.

In addition, additional on-chip circuitry can be included to improve the performance of the image sensor, minimize the size of the device, and reduce the manufacturing costs for the device.

Further, according to embodiments of the present invention, the photodiode is formed above the transistor circuitry, and an insulating property between unit pixels of photodiodes can be ensured to isolate and reduce cross-talk between unit pixels.

Hereinafter, details of a method of manufacturing an image sensor according to an embodiment of the present invention will be described with reference to FIGS. 2 to 6.

Figure 2:
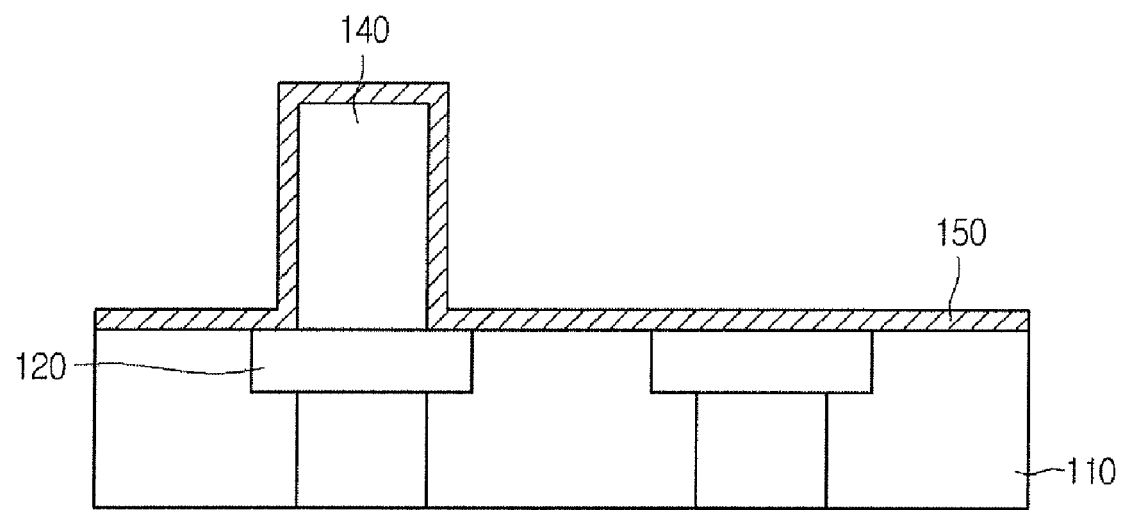
FIGS. 2 to 6 are cross-sectional views showing the procedure of manufacturing an image sensor according to an embodiment of the present invention.

Referring to FIG. 2, CMOS circuitry (not shown) including lower interconnections 120 can be formed on a substrate.

In one embodiment, a barrier metal (not shown) can be formed on an interlayer dielectric layer (ILD) 110, including the lower interconnections 120. The barrier metal can be, for example, tungsten, titanium, tantalum, tungsten nitride, titanium nitride, or tantalum nitride. In an alternative embodiment, the barrier metal may not be formed.

Thereafter, a first interconnection 140 can be formed on a lower interconnection 120. The first interconnection 140 can be electrically connected to one of the lower interconnections 120.

The first interconnection 140 can be formed of conductive materials such as metal, alloy, and silicide. For example, the first interconnection 140 can include aluminum, copper, or cobalt.

Referring again to FIG. 2, a first conductive-type conductive layer 150 can be formed on the entire surface of the substrate including the first interconnection 140.

The first conductive-type conductive layer 150 can serve as an "N" layer of a PIN diode. Although the first conductive-type conductive layer 150 is described as an N-type conductive-type conductive layer, embodiments are not limited thereto.

According to one embodiment, the first conductive-type conductive layer 150 includes N-doped amorphous silicon, but embodiments are not limited thereto.

In other words, the first conductive-type conductive layer 150 can be formed of, for example, a-Si:H, a-SiGe:H, a-SiC:H, a-SiN:H, or a-SiO:H obtained by doping amorphous silicon with germanium, carbon, nitrogen, or oxygen (amorphous silicon being denoted as a-Si).

The first conductive-type conductive layer 150 can be formed through a chemical vapor deposition (CVD) process, such as a plasma enhanced chemical vapor deposition (PECVD) process. In an embodiment the first conductive-type conductive layer 150 can be formed using amorphous silicon through a PECVD process by applying a mixture of silane gas ($SiH_4$), $PH_3$, and $P_2H_5$.

Figure 3:
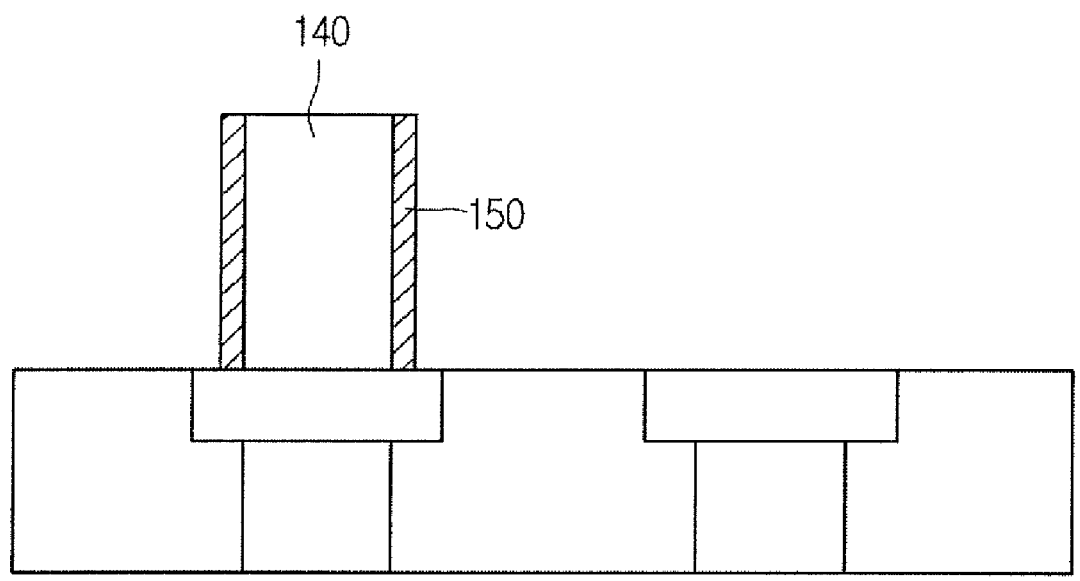

Then, referring to FIG. 3, an etch-back process can be performed with respect to the first conductive-type conductive layer 150 to form the first conductive-type conductive layer at both sides of the first interconnection 140.

Figure 4:
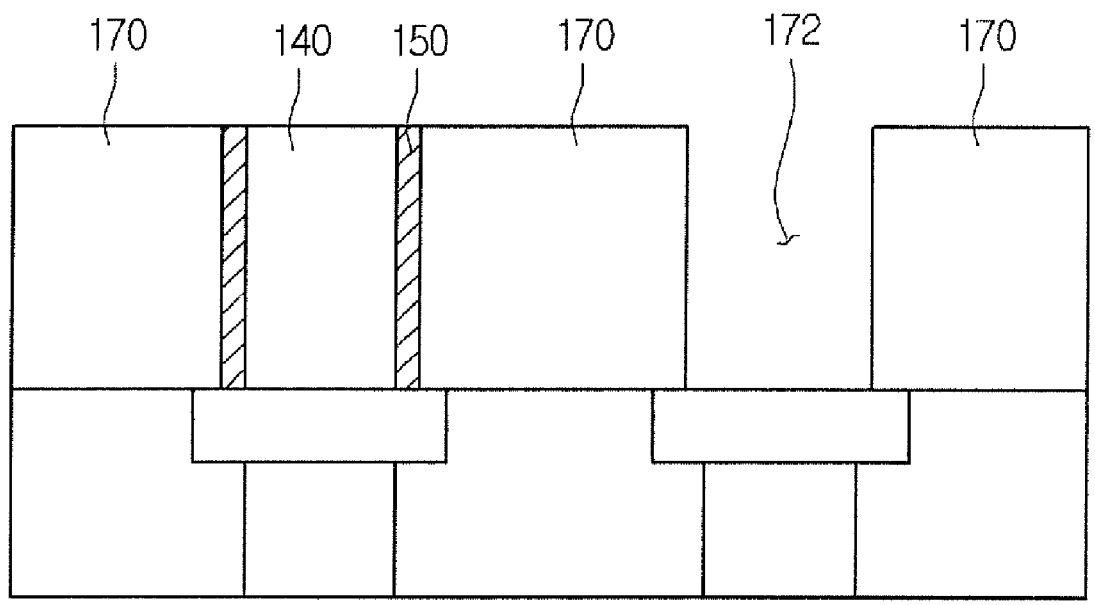

Thereafter, referring to FIG. 4, an intrinsic layer 170 can be formed on the substrate including the first conductive-type conductive layer 150, and a trench 172 can be formed therein.

At this time, the intrinsic layer 170 can serve as an "I" layer of the PIN diode according to an embodiment.

The intrinsic layer 170 can be formed by using amorphous silicon. The intrinsic layer 170 can be formed through a CVD process, such as a PECVD process. For example, the intrinsic layer 170 can be formed using amorphous silicon through the PECVD process by applying silane gas $SiH_4$.

After forming the intrinsic layer 170, a trench 172 can be formed at a position for the second interconnection 145. The second interconnection 145 can be formed corresponding to a lower interconnection 120.

Figure 5:
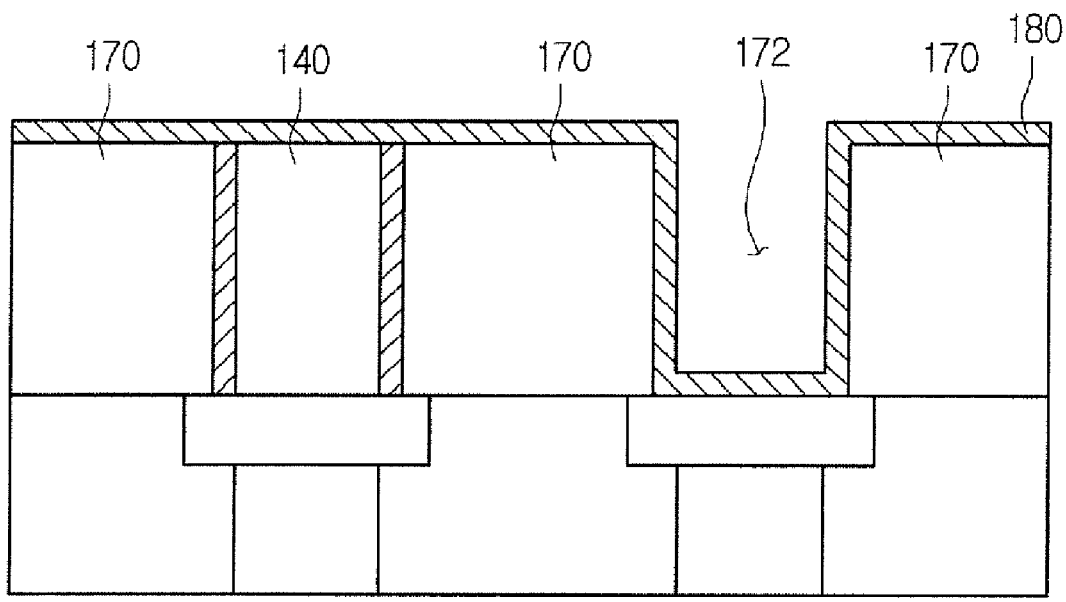

Referring to FIG. 5, a second conductive-type conductive layer 180 can be formed on the entire surface of the substrate including at side surfaces of the trench 172 of the intrinsic layer 170.

The second conductive-type conductive layer 180 can serve as a "P" layer of the PIN diode according to an embodiment. Although the second conductive-type conductive layer 180 is described as a P-type conductive-type conductive layer, embodiments are not limited thereto.

The second conductive-type conductive layer 180 can be formed through a CVD process, such as a PECVD process. For example, the second conductive-type conductive layer 180 can be formed using amorphous silicon through a PECVD process by applying a mixture of silane gas $SiH_4$ and boron.

Figure 6:
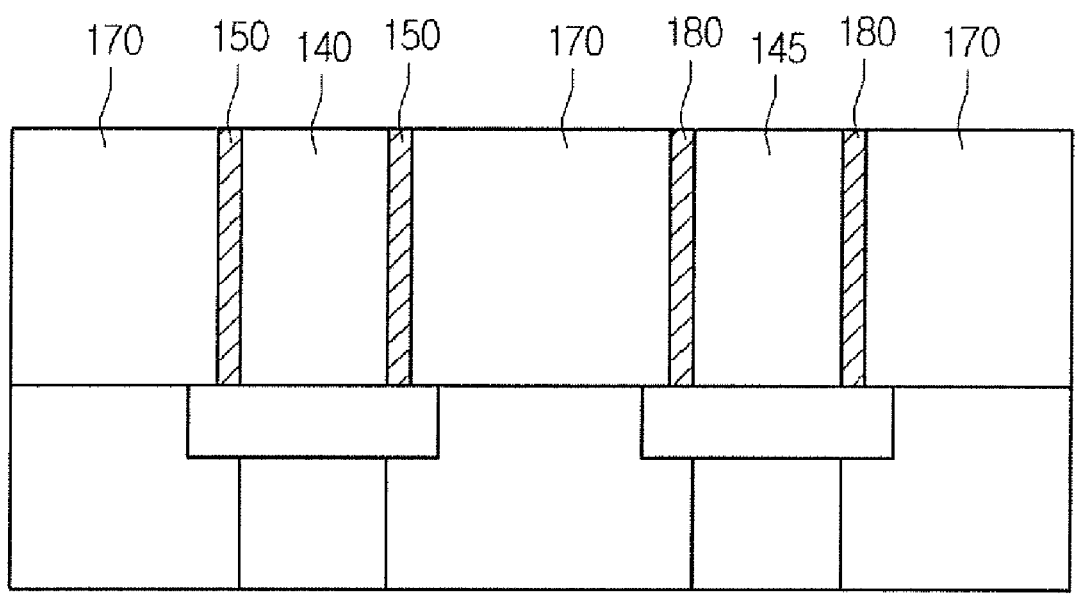

Then, referring to FIG. 6, in one embodiment the substrate formed with the second conductive-type conductive layer 180 can be planarized such that the first interconnection 140 is exposed. The substrate can be planarized, for example, through a chemical mechanical polishing (CMP) process. The portion of the second conductive-type conductive layer 180 formed at the bottom surface of the trench 172 is also removed. This portion can be removed by performing an etching process. In an embodiment, the second conductive-type conductive layer 180 can be removed from the surface of the substrate including the intrinsic layer 170 and the bottom surface of the trench 172 through an etch back process. In another embodiment a portion of the second conductive-type conductive layer 180 formed on one of the sidewalls of the trench 172 can also be removed.

After removing the second conductive-type conductive layer 180 such that the second conductive-type conductive layer 180 only remains on the sidewall(s) of the trench 172, a second interconnection 145 can be formed in the trench 172. The second interconnection 145 can be formed of the same materials as the first interconnection 140.

Accordingly, a photodiode is formed above the transistor circuitry, and isolation and reduction of cross-talk between unit pixels of photodiodes can be ensured.

Furthermore, since the photodiode is formed above the transistor circuitry and has a horizontal structure, the process for an upper interconnection such as a transparent electrode can be omitted. Accordingly, the image sensor according to the above described embodiments can be manufactured through a typical semiconductor manufacturing process without additional equipment used for fabricating the transparent electrode.

FIGS. 7 to 11 are cross-sectional views showing a method of manufacturing an image sensor according to another embodiment.

Different from the embodiments describe with respect to FIGS. 2 to 6, the embodiments described with respect to FIGS. 7 to 11 are characterized in that an etching process with respect to the intrinsic layer 170 is reduced, thereby inhibiting the occurrence of defects in the photodiode.

Figure 7:
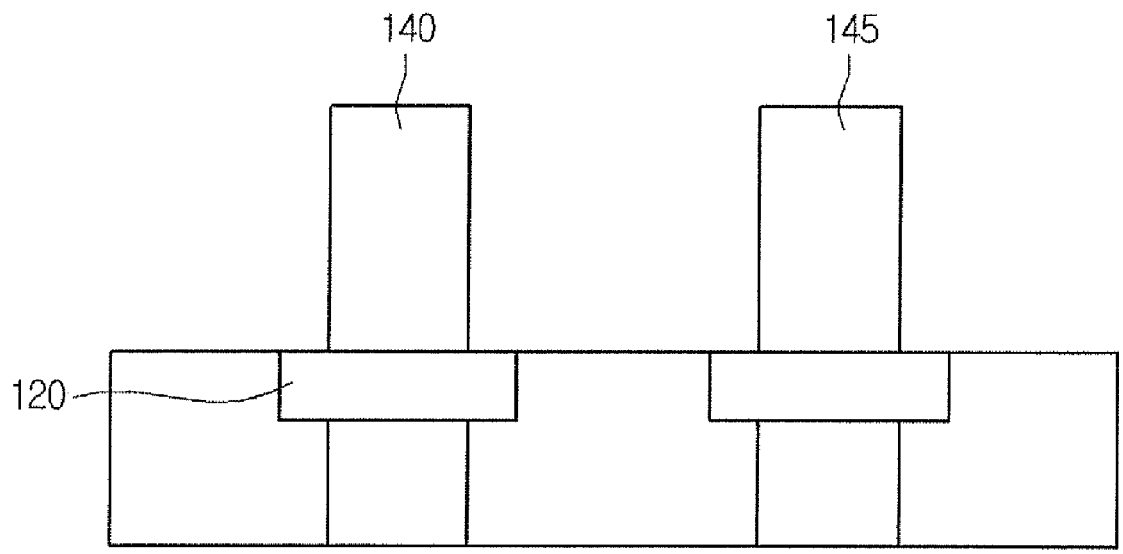
FIGS. 7 to 11 are cross-sectional views showing the procedure of manufacturing an image sensor according to another embodiment of the present invention.

Referring to FIG. 7, CMOS circuitry (not shown) including lower interconnections 120 can be formed on a substrate.

Then, first and second interconnections 140 and 145 corresponding to the lower interconnections 120 can be formed on the substrate.

Figure 8:
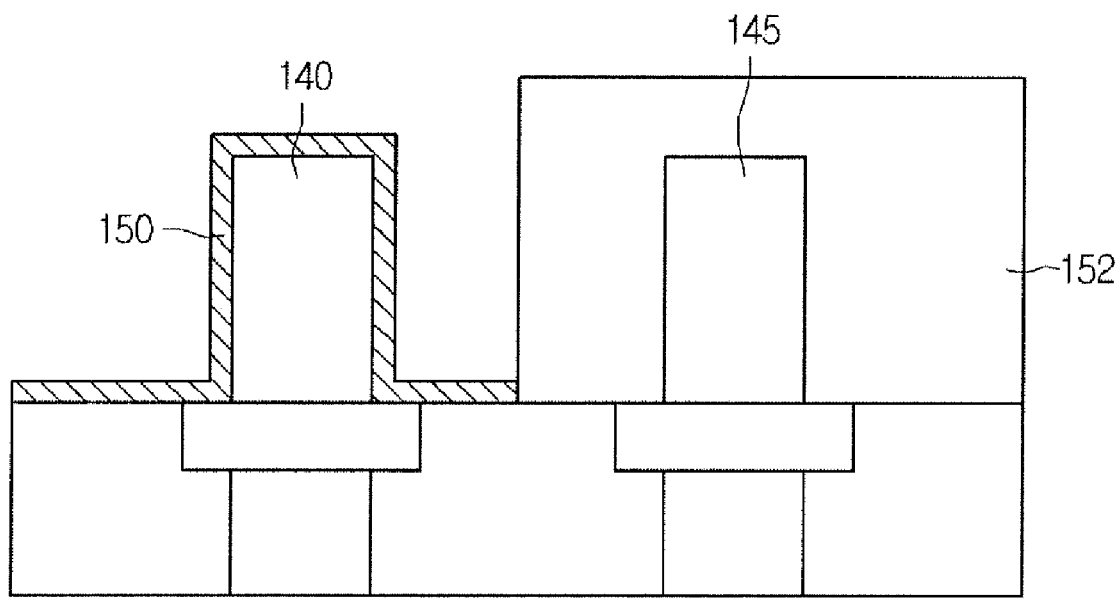

Thereafter, referring to FIG. 8, a first conductive-type conductive layer 150 is formed at side surfaces of the first interconnection 140.

In order to perform the above mentioned process, a first photoresist pattern 152 can be formed covering the second interconnection 145 and exposing the first interconnection 140.

Then, the first conductive-type conductive layer 150 can be formed on the exposed first interconnection 140.

Thereafter, an etch-back process can be performed with respect to the first conductive-type conductive layer 150, so that the first conductive-type conductive layer 150 remains at sidewalls of the first interconnection 140. Then, the first photoresist pattern 152 can be removed.

Figure 9:
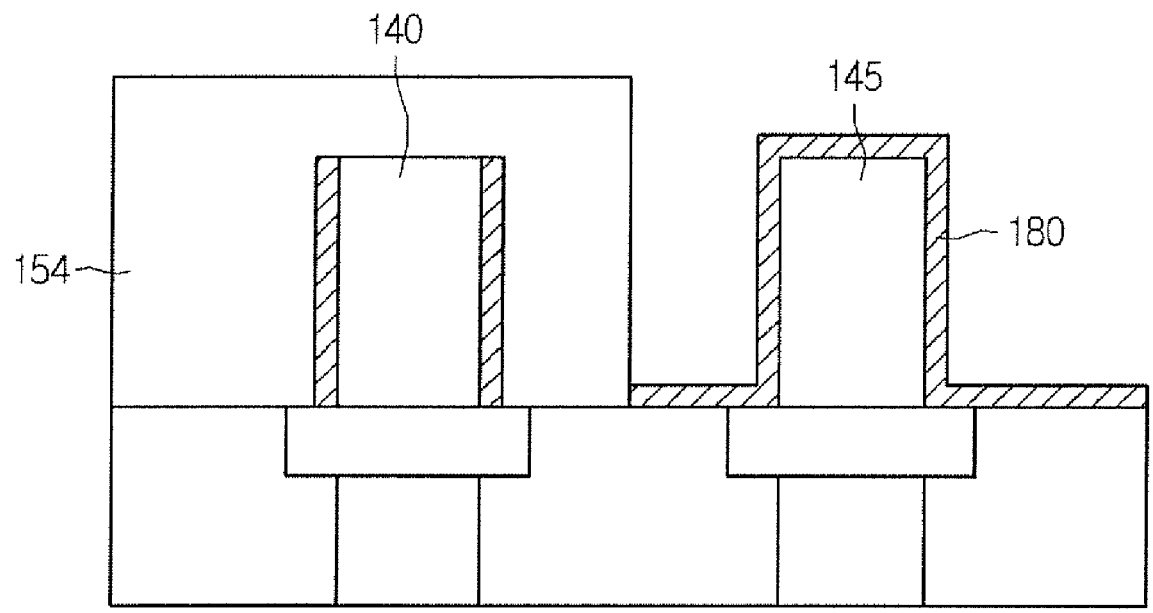

Next, referring to FIG. 9, the second conductive-type conductive layer 180 is formed at side surfaces of the second interconnection 145.

In order to perform the above mentioned process, a second photoresist pattern 154 can be formed covering the first interconnection 140 and exposing the second interconnection 145.

Thereafter, a second conductive-type conductive layer 180 can be formed on the exposed second interconnection 145.

Figure 10:
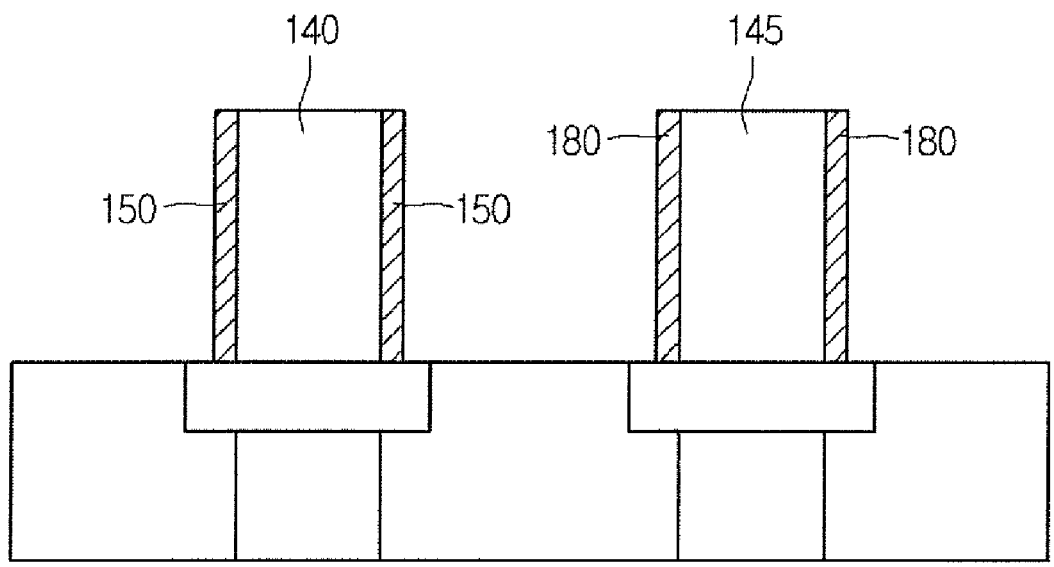

Then, referring to FIG. 10, an etch-back process can be performed with respect to the second conductive-type conductive layer 180 such that the second conductive-type conductive layer 180 remains at sidewalls of the second interconnection 145. Thereafter, the second photoresist pattern 154 is removed.

Figure 11:
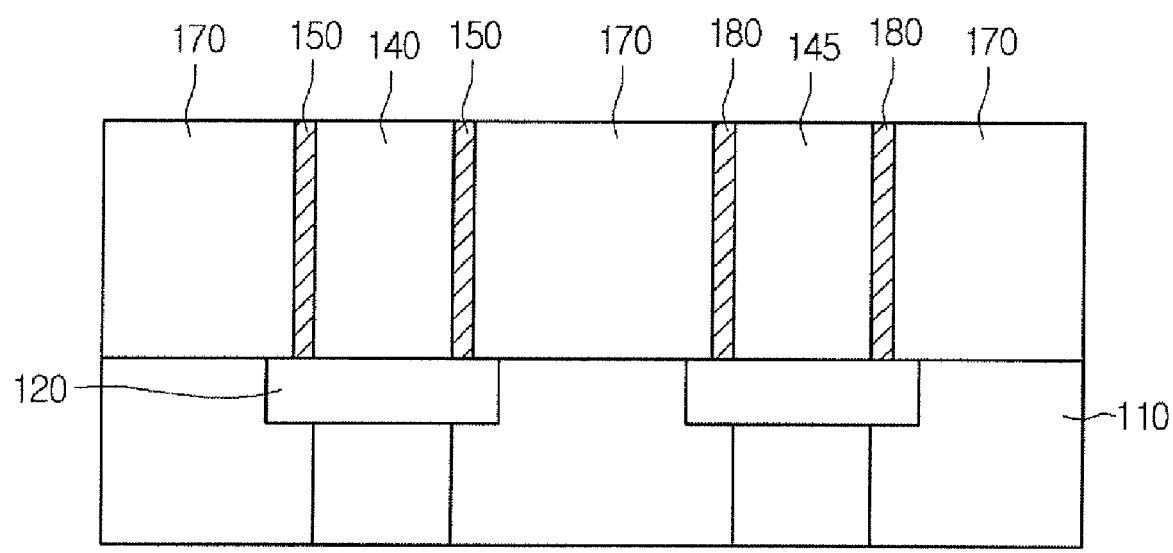

Next, referring to FIG. 11, an intrinsic layer 170 can be formed on the substrate including the first conductive-type conductive layer 150 and the second conductive-type conductive layer 180. The intrinsic layer 170 can be deposited to fill the space between the first conductive-type conductive layer 150 and the second conductive-type conductive layer 180.

Then, in one embodiment, the substrate can be planarized until the first and second interconnection 140 and 145 are exposed.

Accordingly, an etching process for the intrinsic layer 170 is minimized, thereby inhibiting the defects from occurring in the photodiode.

In the image sensor and the method of manufacturing the same according to embodiments of the present invention, the photodiode can be positioned above the transistor circuitry.

According to the embodiments, a fill factor can approach 100%.

In addition, sensitivity higher than that of the related art can be provided relative to the same pixel size.

According to certain embodiments, manufacturing costs can be reduced in order to realize the same resolution as that of the related art.

According to an embodiment, each unit pixel can be realized as a more complicated circuitry without reducing sensitivity.

Further, additional on-chip circuitry integrated according to an embodiment can improve the performance of the image sensor, minimize the size of a device, and reduce the manufacturing costs for the device.

In addition, the photodiode is formed above the transistor circuitry, so that isolation and reduction of cross-talk between unit pixels of photodiodes can be ensured.

In further embodiments, a color filter array can be arranged on the photodiodes.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, comprising:
   forming a transistor circuit and at least two lower interconnections on a substrate;
   forming a first upper interconnection on a first lower interconnection of the at least two lower interconnections;
   forming a first conductive-type conductive layer on at least one sidewall surface of the first upper interconnection;
   forming an intrinsic layer on the substrate including the first conductive-type conductive layer and the first upper interconnection;
   forming a trench in the intrinsic layer corresponding to a second lower interconnection of the at least two lower interconnections;

forming a second conductive-type conductive layer on at least one sidewall surface of the trench; and forming a second upper interconnection in the trench having the second conductive-type conductive layer.

2. The method according to claim 1, wherein forming the first conductive-type conductive layer on the at least one sidewall surface of the first upper interconnection comprises:

forming a first conductive-type conductive layer on an entire surface of the substrate including the first upper interconnection; and performing an etch-back process with respect to the first conductive-type conductive layer, so that the first conductive-type conductive layer remains at sidewall surfaces of the first upper interconnection.

3. The method according to claim 1, further comprising performing a planarization process to expose a top surface of the first upper interconnection before forming the trench in the intrinsic layer.

4. The method according to claim 1, wherein forming the second conductive-type conductive layer on at least one sidewall surface of the trench comprises:

forming a second conductive-type conductive layer on the intrinsic layer including in the trench; and removing portions of the second conductive-type conductive layer from the top surface of the intrinsic layer and the bottom surface of the trench.

5. The method according to claim 4, wherein removing the portions of the second conductive-type conductive layer comprises:

performing an etch-back process with respect to the second conductive-type conductive layer, so that the second conductive-type conductive layer remains at sidewall surfaces of the trench.

6. The method according to claim 4, wherein removing the portions of the second conductive-type conductive layer comprises:

performing a chemical mechanical polishing process to remove the portion of the second conductive-type conductive layer from the top surface of the intrinsic layer; and performing an etching process to remove portions of the second conductive-type conductive layer in the trench.

7. A method of manufacturing an image sensor, comprising:

forming a transistor circuit and at least two lower interconnections on a substrate;

forming a first upper interconnection and a second upper interconnection corresponding to a first lower interconnection and a second lower interconnection of the at least two lower interconnections, respectively, on the substrate;

forming a first conductive-type conductive layer on at least one sidewall surface of the first upper interconnection;

forming a second conductive-type conductive layer on at least one sidewall surface of the second upper interconnection; and forming an intrinsic layer on the substrate including the first and second conductive-type conductive layers.

8. The method according to claim 7, wherein forming the first conductive-type conductive layer on at least one sidewall surface of the first upper interconnection comprises:

forming a first photoresist pattern on the substrate to cover the second upper interconnection and expose the first upper connection;

forming the first conductive-type conductive layer on the exposed first upper interconnection; and performing an etch-back process with respect to the first conductive-type conductive layer such that the first conductive-type conductive layer is formed at sidewall surfaces of the first upper interconnection.

9. The method according to claim 7, wherein forming the second conductive-type conductive layer on at least one sidewall surface of the second upper interconnection comprises:

forming a second photoresist pattern on the substrate to cover the first upper interconnection and expose the second upper interconnection;

forming the second conductive-type conductive layer on the exposed second upper interconnection; and performing an etch-back process with respect to the second conductive-type conductive layer, so that the second conductive-type conductive layer is formed at sidewall surfaces of the second upper interconnection.

10. The method according to claim 7, further comprising planarizing the intrinsic layer.

* * * * *